(12) United States Patent
Tanamoto et al.

(10) Patent No.: US 6,208,000 B1
(45) Date of Patent: Mar. 27, 2001

(54) SEMICONDUCTOR ELEMENT HAVING CHARGE ACCUMULATING LAYER UNDER GATE ELECTRODE AND USING SINGLE ELECTRON PHENOMENON

(75) Inventors: Tetsufumi Tanamoto; Shinobu Fujita, both of Kawasaki; Koichiro Inomata, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/304,343

(22) Filed: May 4, 1999

(30) Foreign Application Priority Data

May 8, 1998 (JP) .................................. 10-125898

(51) Int. Cl.[7] .................................................. H01L 29/76
(52) U.S. Cl. ......................... 257/402; 257/402; 257/407; 257/414; 257/421; 257/422; 257/659
(58) Field of Search ................................... 257/402, 407, 257/414, 421, 422, 659

(56) References Cited

U.S. PATENT DOCUMENTS

| 5,491,339 | * | 2/1996 | Mitsui et al. | 250/310 |
|---|---|---|---|---|
| 5,760,451 | * | 6/1998 | Yu | 257/382 |
| 5,872,384 | * | 2/1999 | Gabara | 257/421 |
| 5,877,511 | | 3/1999 | Tanamoto et al. . | |
| 5,907,177 | * | 5/1999 | Uda et al. | 257/412 |
| 5,936,291 | * | 8/1999 | Makita et al. | 257/405 |
| 5,937,315 | * | 8/1999 | Xiang et al. | 436/486 |
| 5,998,828 | * | 8/1999 | Ueno et al. | 257/315 |
| 5,998,838 | * | 12/1999 | Tanabe et al. | 257/347 |

FOREIGN PATENT DOCUMENTS

| 5-121407 | | 10/1991 | (JP) . | |
| 5-136137 | | 11/1991 | (JP) . | |
| 6-209002 | | 1/1993 | (JP) . | |
| 405075127 | * | 3/1993 | (JP) | 257/412 |
| 406151842 | * | 3/1993 | (JP) | 257/412 |
| 405102467 | * | 4/1993 | (JP) | 257/412 |
| 6-168942 | | 8/1993 | (JP) . | |
| 10-229086 | | 2/1997 | (JP) . | |

OTHER PUBLICATIONS

S. Tiwari et al., "A Silicon Nanocrystals Based Memory", Appl. Phys. Lett., 68 (10) :1377–1379, (1996) .

S. Tiwari et al, "Volatile and Non–Volatile Memories in Silicon With Nano–Crystal Storage", IEDM 95, pp. 521–524, (1995).

Blech, I.A., "Electromigration in thin aluminum films on titanium nitride," Journal of Applied Physics, vol. 47, No. 4, Apr. 1976.

* cited by examiner

Primary Examiner—Jerome Jackson, Jr.
Assistant Examiner—Edgardo Ortiz
(74) Attorney, Agent, or Firm—Finnegan, Henderson, Farabow, Garrett & Dunner, L.L.P.

(57) ABSTRACT

A semiconductor device according to the invention is constructed as below. A charge accumulating layer which contains a magnetic substance is formed directly on a semiconductor substrate, and a gate insulating film is formed on the charge accumulating layer. Further, a gate electrode is formed on the gate insulating film, and source and drain regions formed in surface portions of the semiconductor substrate such that the gate electrode is interposed therebetween. Another semiconductor device according to the invention is constructed as below. A first gate insulating film formed on a semiconductor substrate, and a charge accumulating layer which contains a magnetic substance is formed on the first gate insulating film. Further, a second gate insulating film is formed on the charge accumulating layer, and a gate electrode is formed on the second gate insulating film. Source and drain regions formed in surface portions of the semiconductor substrate such that the gate electrode is interposed therebetween.

16 Claims, 5 Drawing Sheets

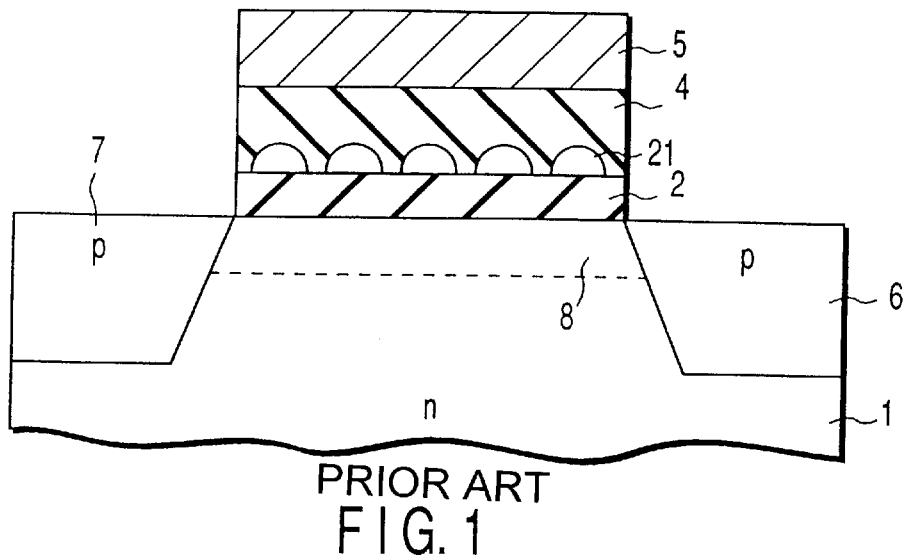
PRIOR ART
FIG. 1
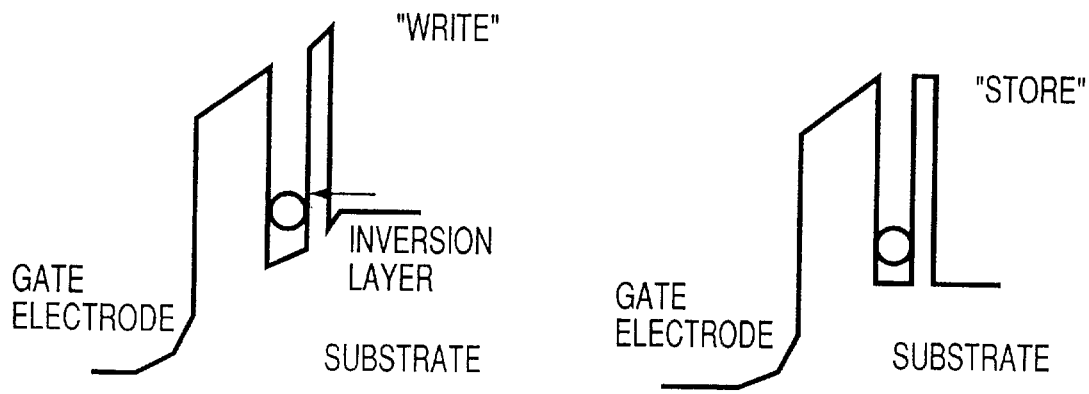
FIG. 2A
FIG. 2B
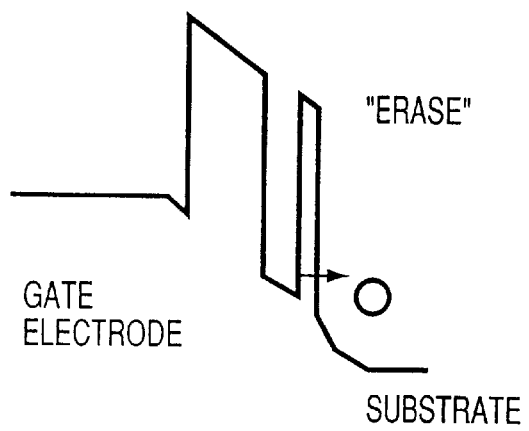
FIG. 2C

SEMICONDUCTOR ELEMENT HAVING CHARGE ACCUMULATING LAYER UNDER GATE ELECTRODE AND USING SINGLE ELECTRON PHENOMENON

BACKGROUND OF THE INVENTION

This invention relates to a semiconductor device having a transistor structure, and more particularly to a semiconductor device having a charge accumulating layer under a gate electrode.

Recently, a floating-gate memory device has been proposed as a structure in which the "single electron phenomenon" is applied to a MOS semiconductor device (IBM, S. Tiwari, IEDM95, p. 521). In this device, a record, which indicates whether or not electrons flowing through the channel of the substrate are accumulated in semiconductor particles in the gate oxide film, will appear in current/voltage characteristics between its source and drain. Therefore, this device is expected to be applied as a memory device.

FIG. 1 is a sectional view illustrating the device structure proposed in the above document. In the figure, reference numeral 1 denotes an Si substrate, reference numeral 2 a tunnel oxide film, reference numeral 4 an $SiO_2$ film, reference numeral 5 a gate electrode, reference numeral 6 a source region, reference numeral 7 a drain region, reference numeral 8 an inversion layer, and reference numeral 21 Si fine particles. This device is characterized in that Si fine particles 21 with a size of about 5 nm are provided on the tunnel oxide film 2 with a thickness of 2 nm or less, and the gate electrode 5 is provided on the resultant structure.

In this device, electrons contained in the inversion layer 8 directly tunnel into the Si fine particles 21 on the tunnel oxide film 2 when a gate voltage has been applied. When electrons have tunneled into the Si fine particles, the electron distribution of a conduction band in the inversion layer 8 located under the Si fine particles 21 varies. As a result, the threshold voltage of a gate having its channel connected to the band changes. Since the change in the threshold voltage is about 0.36V, the state of electrons in the Si fine particles 21 can be sensed by sensing a change in the current flowing through the inversion layer 8 with respect to the gate voltage.

FIGS. 2A, 2B and 2C are views illustrating changes in the conduction band of the above-described device. When a positive voltage has been applied to the gate, electricity is transmitted and accumulated into the Si fine particles from the inversion layer 8 via the tunnel oxide film 2, as is shown in FIG. 2A ("Write" state). Even if the application of the voltage to the gate electrode 5 is stopped, the electricity is retained in the Si fine particles 21, as is shown in FIG. 2B ("Store" state). In this state, the threshold voltage of the transistor increases. On the other hand, when a negative voltage has been applied to the gate, the electricity accumulated in the Si fine particles is discharged to the substrate side via the tunnel oxide film 2, as is shown in FIG. 2C. In this state, the threshold voltage returns to its original value ("Erase" state).

As described above, electricity can be transmitted into, retained in and discharged from the Si fine particles 21, and the threshold voltage of the device varies depending upon whether or not electricity is accumulated in the Si fine particles 21. This being so, this device can be used as a memory device.

Elements of this kind, however, have the following problems; in the conventional floating-gate device using the single electron phenomenon, the distance between a quantum dot and the channel layer of the substrate is as close as about 2 nm. Accordingly, the threshold voltage, which is disadvantageous, if high, in the case of a flash memory, can be suppressed. However, it is highly possible that electrons will return into the substrate. This being so, the retention time, i.e. the time required for the electricity in the quantum dot to discharge into the substrate side, is as short as several months. This is rather shorter than the retention time, i.e. several years, in the case of a usual flash memory which does not use the single electron effect.

Although as described above, the floating-gate device using the single electron effect can have a low threshold voltage but cannot retain electricity for a long time. This is a factor which makes it difficult to use the device as a memory device.

BRIEF SUMMARY OF THE INVENTION

It is the object of the invention to provide a floating-gate semiconductor device using the single electron effect, which has a low threshold voltage and can retain electricity for a sufficiently long time.

(Structure)

According to a first aspect of the invention, there is provided a semiconductor device comprising: a charge accumulating layer containing a magnetic substance and formed directly on a semiconductor substrate; a gate insulating film formed on the charge accumulating layer; a gate electrode formed on the gate insulating film; and source and drain regions formed in surface portions of the semiconductor substrate such that the gate electrode is interposed therebetween.

According to a second aspect of the invention, there is provided a semiconductor device comprising: a first gate insulating film formed on a semiconductor substrate; a charge accumulating layer containing a magnetic substance and formed on the first gate insulating film; a second gate insulating film formed on the charge accumulating layer; a gate electrode formed on the second gate insulating film; and source and drain regions formed in surface portions of the semiconductor substrate such that the gate electrode is interposed therebetween.

According to a third aspect of the invention, there is provided a semiconductor device comprising: a first charge accumulating layer containing a magnetic substance and directly formed on a semiconductor substrate; a first gate insulating film formed on the first charge accumulating layer; at least one second charge accumulating layer containing a magnetic substance and formed on the first gate insulating film; a second gate insulating film formed on the second charge accumulating layer; a gate electrode formed on the second gate insulating film; and source and drain regions formed in surface portions of the semiconductor substrate such that the gate electrode is interposed therebetween.

According to a fourth aspect of the invention, there is provided a semiconductor device comprising: a first gate insulating film formed on a semiconductor substrate; a first charge accumulating layer containing a magnetic substance and formed on the semiconductor substrate; a second gate insulating film formed on the first charge accumulating layer; at least one second charge accumulating layer containing a magnetic substance and formed on the second gate insulating film; a third gate insulating film formed on the second charge accumulating layer; a gate electrode formed on the third gate insulating film; and source and drain regions formed in surface portions of the semiconductor substrate such that the gate electrode is interposed therebetween.

The following features are preferable for the embodiments of the invention:
(1) The charge accumulating layer contains magnetic fine particles or is formed of a magnetic film;
(2) The semiconductor substrate is formed of an Si substrate or an SOI substrate;
(3) The charge accumulating layer contains Co, Fe, FeNi, Ni or CoPt;
(4) The magnetic fine particles have a size of 1–50 nm; and
(5) Where two or more charge accumulating layers are provided, a low resistance semiconductor such as polysilicon is used as the material of a charge accumulating layer as a second or any other layer except a first layer.

(Effect)

The effect of this invention will be described.

This invention is characterized by a magnetic substance used as the material of a charge accumulating layer, and in particular by a magnetic substance used as the material of a quantum dot formed in a gate insulating film. Further, the invention is characterized in that a magnetic substance is directly provided on a semiconductor substrate. This uses the fact that a Schottky barrier is formed between magnetic fine particles as metal particles and a semiconductor substrate. The Schottky barrier is used in place of a thin tunnel oxide film which is necessary to form in the conventional case. Also, the invention is characterized in that the magnetic substance is in the form of fine particles or a thin film.

Hamiltonian of electrons in magnetic fine particles is expressed as follows:

$$H = \sum_\sigma \left[ \frac{\hbar^2 \vec{k}_\sigma^2}{2m} - \vec{\sigma} \cdot \vec{h} \right] \quad (1)$$

where $\vec{\sigma}$ represents the Pauli's spin matrix, and $\vec{h}$ the internal magnetic field of the magnetic fine particles. The state density of the spin electrons σ of the magnetic fine particles is $D_\sigma(E) = a\sqrt{E + \vec{\sigma} \cdot \vec{h}}$
(FIG. 1) (a: a constant). The electrons having entered the magnetic fine particles are stabilized in magnetic energy after a relaxing process.

FIG. 3A shows the state density of electrons in the case of non-magnetic fine particles, while FIG. 3B shows the state density of electrons in the case of magnetic fine particles. The holding period in time is expressed by the transmission probability of electrons on the Fermi surface. Since the transmission probability is proportional to the state density of electrons, the difference ΔT in the transmission probability of electrons between the case of magnetic fine particles and the case of non-magnetic fine particles is given by $$\Delta T \propto D_\uparrow(E_F) + D_\downarrow(E_F) - 2D_0(E_F) \quad (2)$$
$$= a\left(\sqrt{E_F + h} + \sqrt{E_F - h} - 2\sqrt{E_F}\right)$$
$$\approx -a\frac{\sqrt{E_F}}{4}\left(\frac{h}{E_F}\right)^2 < 0$$

where $\sqrt{E_F + h} \approx \sqrt{E_F}(1 + \frac{1}{2}(h/E_F) - \frac{1}{8}(h/E_F)^2)$ As is evident from the above formula, the transmission probability decreases in proportion to the square of the internal magnetic field.

Accordingly, the extra energy ΔEm retained in a quantum dot when the fine particles are magnetic is given by $$\Delta E_m \propto \frac{1}{4}\left(\frac{h}{E_F}\right)^2 E_F \quad (3)$$

For example, where EF=5 eV and h=1 eV, ΔEm=0.05 eV. The time required for electrons to go out of the quantum dot against the energy barrier is estimated to be given by the following formula, supposing that $$t \sim t0 \exp(\Delta Em/kBt) \quad (4)$$

where t0 represents the retention time of the conventional Tiwari-type device.

Accordingly, at room temperature, the retention time is from (exp (0.05/0.235)) times to 8.4 times longer since kBT=2.35×10⁻² eV. FIG. 4 shows the contents of formula (4), indicating the effective internal magnetic field by the abscissa and the rate of increase in retention time by the ordinate. As is understood from FIG. 4, the retention time in the case of using an Fe device is about 8 times longer than the case of using a conventional device. The energy of a barrier in a general case where a plurality of quantum dots are arranged is higher than the case of a single quantum dot, since coupling energy exists between quantum dots. This means that a device with a plurality of quantum dots is more stabilized and has a longer retention time.

Furthermore, where magnetic fine particles are made to contact the semiconductor substrate, the particles and the substrate are connected by metal-semiconductor Schottky connection. As a result, the same tunnel barrier as in the case of interposing an oxide film is formed between quantum dots and the substrate, and the same effect as above can be obtained. Also, where magnetic fine particles are made to contact the semiconductor substrate, a process step for forming a very thin tunnel oxide film that requires high precision can be omitted from the manufacturing process. This is very advantageous. The threshold voltage at the time of writing is determined mainly from the distance between the semiconductor substrate and the fine particles, the dielectric constant of an insulating film interposed therebetween, or the height of the Schottky barrier. Therefore, at least the same threshold voltage can be set as that of the aforementioned device proposed by S. Tiwari.

In addition, the phenomenon in which the retention time can be increased using a magnetic barrier will appear in a usual charge accumulating layer of a film structure, as well as the aforementioned layer of a fine-particle structure. Accordingly, the same advantage as above can be also obtained from the film structure layer.

It is preferable to determine from the size of the semiconductor device whether a fine particle structure or a film structure should be imparted to the charge accumulating layer. Also, it is preferable to impart the film structure to a semiconductor device through which a lot of current is to be flown, and to impart the fine particle structure to one through which a fine current is to be flown.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view illustrating the structure of a conventional floating-gate device using the single electron effect;

FIGS. 2A–2C are views illustrating changes in the conduction band of the device of FIG. 1;

DETAILED DESCRIPTION OF THE INVENTION

The invention will be described in detail with reference to the accompanying drawings.

(First Embodiment)

Figures 3A, 3B:
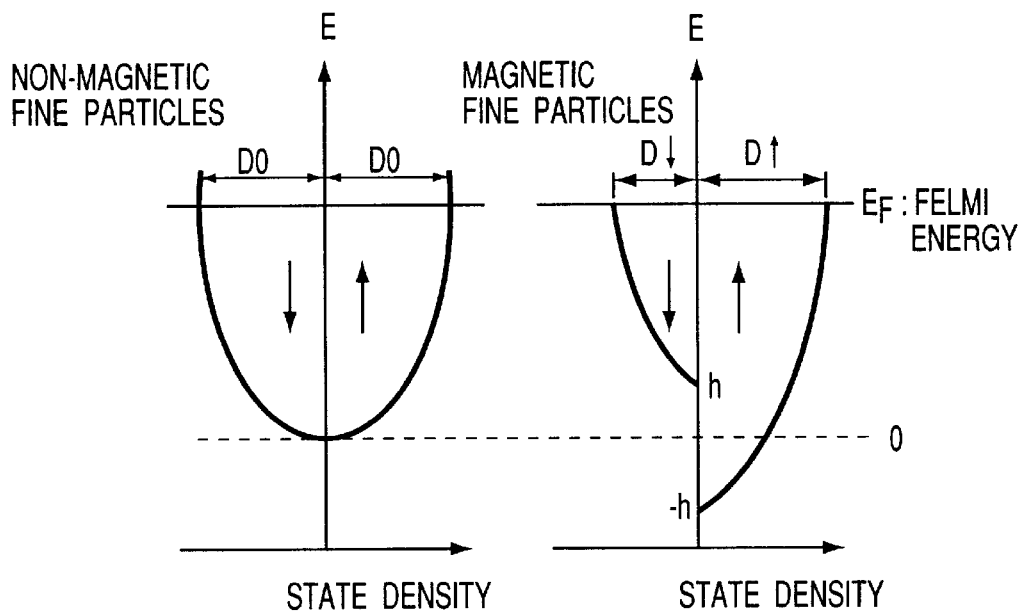
FIG. 3A is a graph showing the state density of electrons in the case of non-magnetic fine particles.
FIG. 3B is a graph showing the state density of electrons in the case of magnetic fine particles.
Figure 4:
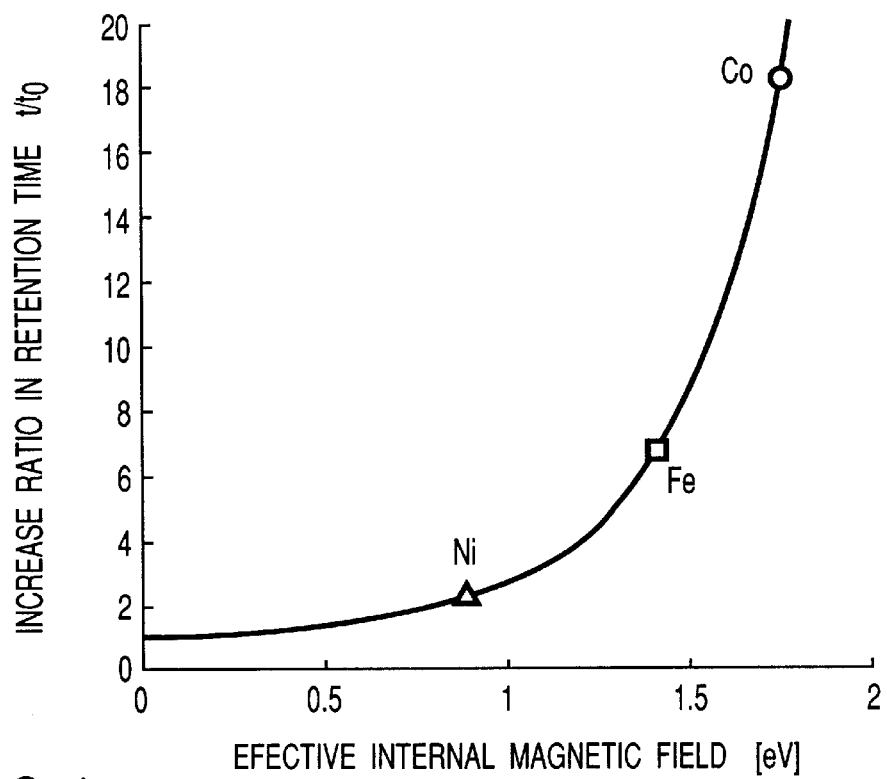
FIG. 4 is a graph showing the relationship between the effective internal magnetic field of the magnetic fine particles and the rate of increase in retention time of electrons.
Figure 5:
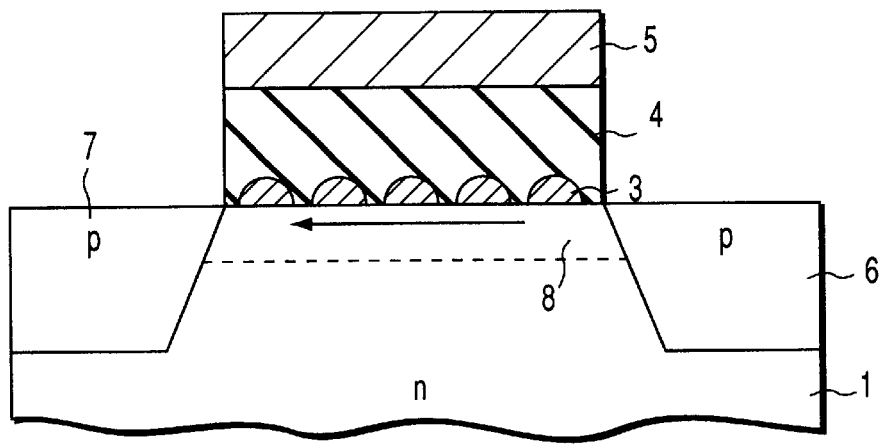
FIG. 5 is a sectional view illustrating the structure of a semiconductor device according to a first embodiment of the invention.

FIG. 5 is a sectional view illustrating the structure of a semiconductor device according to a first embodiment of the invention.

As is shown in the figure, magnetic fine particles 3 (which constitute a charge accumulating layer) are provided on an n-type Si semiconductor substrate 1. A gate electrode 5 is formed on the magnetic fine particles 3 with an Si oxide film 4 (gate insulating layer) interposed therebetween. Source and drain p-type regions 6 and 7 are formed on the substrate 1 such that the gate electrode 5 is located therebetween. In this semiconductor device, the magnetic fine particles 3 are directly provided on the Si substrate 1, thereby establishing Schottky connection.

The device of this embodiment is manufactured in a process stated as below. First, a device region is formed on the Si substrate 1 by the usual LSI process. After that, magnetic Co fine particles 3 with a size of, for example, about 10 nm are directly provided on the Si substrate 1 by sputtering. In this process, uniaxial aelotropy for magnetization may be imparted to the magnetic fine particles 3 by sputtering in the magnetic field.

Subsequently, an Si oxide ($SiO_2$) film 4 with a thickness of about 7 nm is formed on the magnetic fine particles 3 by CVD. Then, a polysilicon film is deposited on the Si oxide film 4 by LPCVD, and is patterned into a gate electrode 5. After that, a p-type impurity is implanted into a surface of the substrate by ion implantation, using the gate electrode 5 as a mask, thereby forming the source and drain regions 6 and 7.

An SOI (Silicon On Insulator) substrate may be used in place of the Si substrate 1. Further, a material other than Co, such as Fe, FeNi, Ni, CoPt, etc., may be used for the magnetic fine particles 3.

In the subsequent process steps, contact holes are formed after an interlayer insulating film is formed, and lines are formed to connect the electrode with three terminals to external electrodes.

Where the magnetic fine particles 3 are directly formed on the Si substrate 1 as in the embodiment, the particles 3 and the substrate 1 are connected by metal-semiconductor Schottky connection. Accordingly, the same tunnel barrier is formed between a quantum dot and the substrate 1 as in the case of interposing an oxide film therebetween. Thus, this embodiment is characterized in that a magnetic substance is directly formed on the semiconductor substrate. This structure uses, as a thin tunnel oxide film, a Schottky barrier formed between metallic magnetic fine particles and a semiconductor substrate.

The threshold voltage of the device of the first embodiment, which is constructed as above and used as a transistor, can be varied using a tunnel effect which occurs between the inversion layer 8 and the fine particles 3. Using a change in threshold voltage enables the use of the device as a memory device, like the conventional device shown in FIG. 1. The principle of the threshold voltage change is basically similar to that described with reference to FIGS. 2A–2C. Further, since in this case, the layer of the magnetic fine particles 3 is used as a charge accumulating layer, its magnetic barrier increases the retention time.

More specifically, the threshold voltage was 1.25V when no electricity was accumulated in the fine particles 3. When a voltage of +2V was applied to the gate to thereby inject electricity into the fine particles 3, the threshold voltage increased to 1.6V. When, on the other hand, a voltage of –2V was applied to the gate to thereby discharge the electricity from the fine particles 3 to the substrate side, the threshold voltage returned to 1.25V. Accordingly, if a voltage of, for example, 1.4V is applied as a "read" voltage, data can be read from the transistor which is in the ON or OFF state. Moreover, since in this embodiment, a magnetic substance is used as the material of the fine particles 3, the retention time is significantly longer than the case of using the Si fine particles.

As described above, in the first embodiment, the threshold voltage of the floating-gate device (as a non-volatile memory cell) using the single electron effect is reduced using the layer of the magnetic fine particles 3 as its charge accumulating layer. Also, the threshold voltage can be controlled accurately by controlling the number of the fine particles 3. Moreover, using a magnetic substance as the material of the fine particles 3 sufficiently increases the retention time of the electrons. As a result, the semiconductor device of the embodiment is suitable as a non-volatile memory.

The Schottky barrier formed at the boundary between the magnetic fine particles and the Si substrate is very advantageous to the device manufacturing process, since it makes unnecessary the step of forming a tunnel oxide film.

(Second Embodiment)

Figure 6:
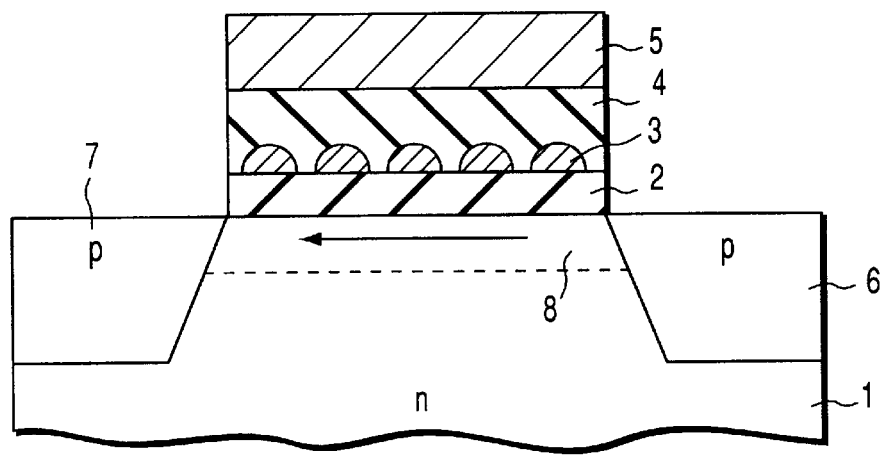
FIG. 6 is a sectional view illustrating the structure of a semiconductor device according to a second embodiment of the invention.

FIG. 6 is a sectional view illustrating the structure of a semiconductor device according to a second embodiment of the invention. An element similar to that in FIG. 5 is denoted by a corresponding reference numeral, and no detailed description will be given thereof.

The second embodiment is basically similar in structure to the first embodiment, except that a tunnel oxide film 2 is formed between the Si substrate 1 and the magnetic fine particles 3, instead of directly providing the particles 3 on the substrate 1.

As is shown in FIG. 6, magnetic fine particles 3 (which constitute a charge accumulating layer) are provided on the an n-type Si substrate 1 with a tunnel oxide film 2 (first gate insulating film) interposed therebetween. A gate electrode 5 is formed on the magnetic fine particles 3 with an Si oxide film 4 (second gate insulating film) interposed therebetween. Source and drain p-type regions 6 and 7 are formed on the substrate 1 such that the gate electrode 5 is located therebetween.

The device of this embodiment is manufactured in a process stated as below. First, a device region is formed on the Si substrate 1 by the usual LSI process. After that, a tunnel oxide film 2 with a thickness of about 2 nm is formed on the Si substrate 1. Then, magnetic Co fine particles 3 with a size of, for example, about 10 nm are provided on the tunnel oxide film 2 by sputtering. In this process, uniaxial aelotropy for magnetization may be imparted to the magnetic fine particles 3 by sputtering in the magnetic field.

Subsequently, an Si oxide ($SiO_2$) film 4 with a thickness of about 7 nm is formed on the magnetic fine particles 3 by CVD. Then, a polysilicon film is deposited on the Si oxide film 4 by LPCVD, and is patterned into a gate electrode 5. After that, a p-type impurity is implanted into a surface of the substrate by ion implantation, using the gate electrode 5 as a mask, thereby forming the source and drain regions 6 and 7.

An SOI (Silicon On Insulator) substrate may be used in place of the Si substrate 1. Further, a material other than Co, such as Fe, FeNi, Ni, CoPt, etc., may be used for the magnetic fine particles 3.

In the subsequent process steps, contact holes are formed after an interlayer insulating film is formed, and lines are formed to connect the electrode with three terminals to external electrodes.

Like the device of the first embodiment, the threshold voltage of the device of the second embodiment, which is constructed as above and used as a transistor, can be varied using a tunnel effect that occurs between the inversion layer 8 and the fine particles 3. Using a change in threshold voltage enables the use of the device as a memory device, like the conventional device shown in FIG. 1. The principle of the threshold voltage change is basically similar to that described with reference to FIGS. 2A–2C. Further, since in this case, the layer of the magnetic fine particles 3 is used as a charge accumulating layer, its magnetic barrier increases the retention time.

As described above, in the second embodiment, the threshold voltage of the floating-gate device (as a nonvolatile memory cell) using the single electron effect is reduced using the layer of the magnetic fine particles 3 as its charge accumulating layer. Also, the threshold voltage can be controlled accurately by controlling the number of the fine particles 3. Moreover, using a magnetic substance as the material of the fine particles 3 sufficiently increases the retention time of the electrons. As a result, the semiconductor device of the embodiment is suitable as a non-volatile memory.

(Third Embodiment)

Figure 7A:
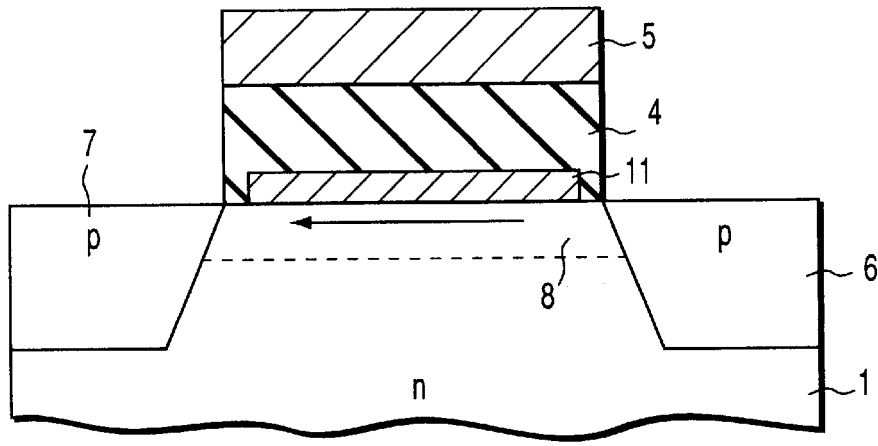
FIGS. 7A and 7B are sectional views illustrating the structures of semiconductor devices according to a third embodiment of the invention.
Figure 7B:
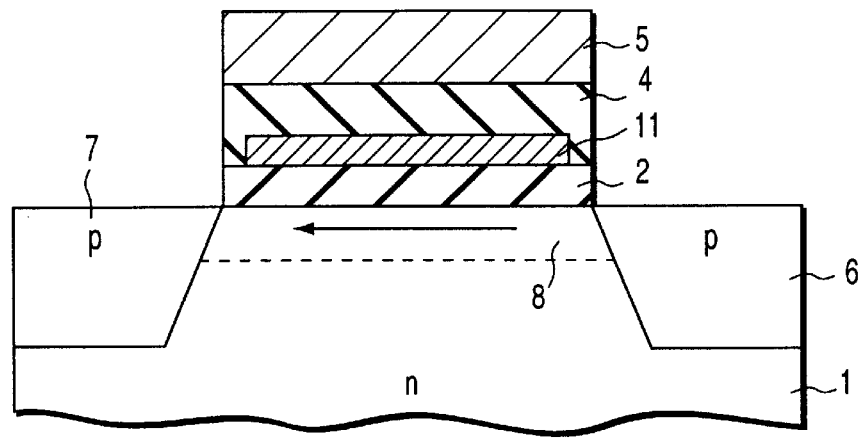

FIGS. 7A and 7B are sectional views illustrating the structures of semiconductor devices according to a third embodiment of the invention. An element similar to that in FIGS. 5 and 6 are denoted by a corresponding reference numeral, and no detailed description will be given thereof.

The third embodiment is characterized by a magnetic film used in place of the magnetic fine particles in the first and second embodiments. Specifically, in a semiconductor device shown in FIG. 7A, a magnetic island 11 (magnetic film) made of CoPt is formed in place of the magnetic fine particles 3 in FIG. 5, and the other structure is the same as the first embodiment of FIG. 5. On the other hand, in a semiconductor device shown in FIG. 7B, a magnetic island 11 (magnetic film) made of CoPt is formed in place of the magnetic fine particles 3 in FIG. 6, and the other structure is the same as the second embodiment of FIG. 6.

Although the devices of the third embodiment do not use the single electron effect, the third embodiment also has a sufficiently long retention time as a result of using a magnetic substance as the material of the floating gate, and hence has the same advantage as in the first and second embodiments.

(Fourth Embodiment)

Figure 8A:
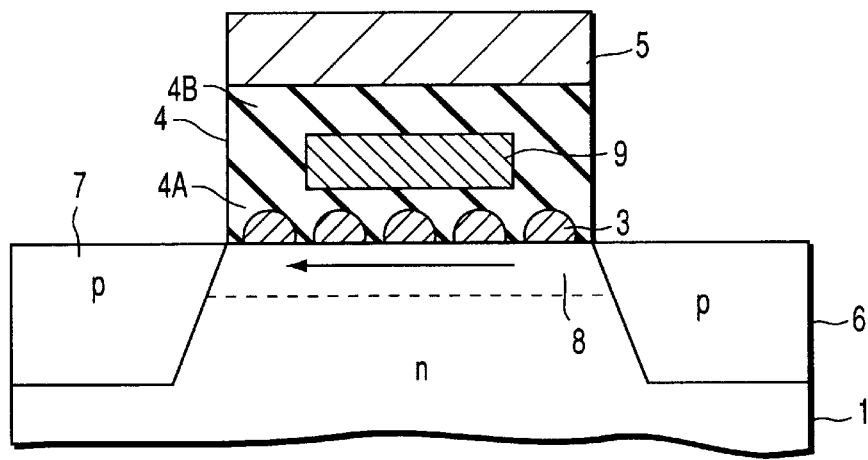
FIGS. 8A and 8B are sectional views illustrating the structures of semiconductor devices according to a fourth embodiment of the invention.
Figure 8B:
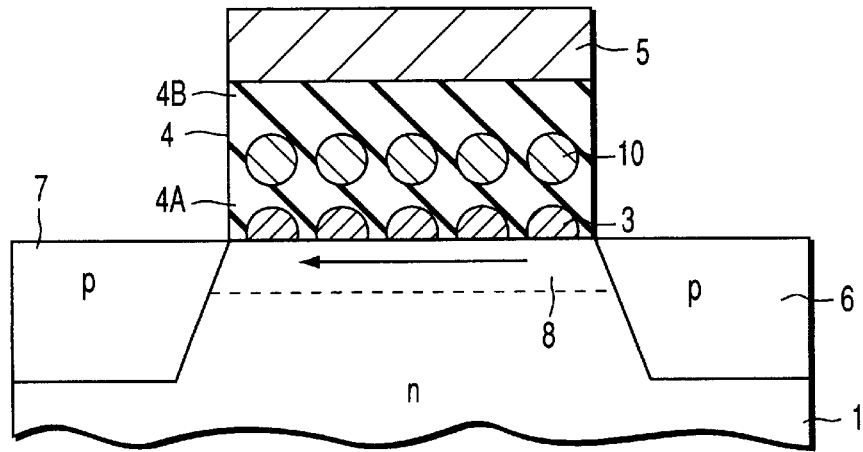

FIGS. 8A and 8B are sectional views illustrating the structures of semiconductor devices according to a fourth embodiment of the invention. An element similar to that in FIG. 5 is denoted by a corresponding reference numeral, and no detailed description will be given thereof.

This embodiment differs from the first embodiment in that the former employs charge accumulating layers (formed of magnetic fine particles or magnetic films) arranged in two stages. Specifically, in a semiconductor device shown in FIG. 8A, a magnetic film 9 (second charge accumulating layer) is formed on the layer (first charge accumulating layer) of the magnetic fine particles 3, with an Si oxide film 4A interposed therebetween. On the other hand, in a semiconductor device shown in FIG. 8B, the layer (second charge accumulating layer) of magnetic fine particles 10 is formed on the layer (first charge accumulating layer) of the magnetic fine particles 3, with an Si oxide film 4A interposed therebetween. Further, a gate electrode 5 is formed on the magnetic film 9 or the magnetic fine particles 10, with an Si oxide film 4B interposed therebetween. A low-resistance semiconductor film such as a polysilicon film may be used instead of the magnetic film 9 as the second charge accumulating layer.

The device of this embodiment is manufactured in a process stated as below. First, a device region is formed on the Si substrate 1 by the usual LSI process. Then, magnetic Co fine particles 3 with a size of, for example, about 10 nm are provided on the Si substrate 1 by sputtering. As a result, a metal-semiconductor Schottky barrier is formed between the magnetic fine particles 3 and the substrate 1. In this process, uniaxial aelotropy for magnetization may be imparted to the magnetic fine particles 3 by sputtering in the magnetic field.

Subsequently, an Si oxide ($SiO_2$) film 4A (first gate insulating film) with a thickness of about 2 nm is formed on the magnetic fine particles 3 by CVD. Then, again using sputtering, a CoPt magnetic island 9 (magnetic film) as shown in FIG. 8A or the layer of Co magnetic fine particles 10 as shown in FIG. 8B is formed on the Si oxide film 4A. Further, an Si oxide film 4B (second gate insulating film) with a thickness of about 3 nm is formed by CVD on the magnetic island 9 or the magnetic fine particles 10.

After that, a polysilicon film is deposited on the Si oxide film 4B by LPCVD and patterned into a gate electrode 5. Then, a p-type impurity is implanted into a surface of the substrate by ion implantation, using the gate electrode 5 as a mask, thereby forming the source and drain regions 6 and 7.

An SOI substrate may be used in place of the Si substrate 1. Further, a material other than Co, such as Fe, FeNi, Ni, CoPt, etc., may be used for the magnetic fine particles 3.

In the subsequent process steps, contact holes are formed after an interlayer insulating film is formed, and lines are formed to connect the electrode with three terminals to external electrodes.

Since in the fourth embodiment constructed as above, both the magnetic fine particles 3 and the magnetic film 9 (or a low-resistance semiconductor film) or the layer of the magnetic fine particles 10 serve as charge accumulating layers, the same advantage as the first embodiment can be obtained. Moreover, in the fourth embodiment, the accumulation amount of tunnel charge, i.e. the amount of charge accumulated in the charge accumulating layers, can be increased as compared with the first embodiment, thereby increasing a change in threshold voltage. Increase of a change in threshold voltage means an increase in read margin when the device is used as a memory device.

(Fifth Embodiment)

Figure 9A:
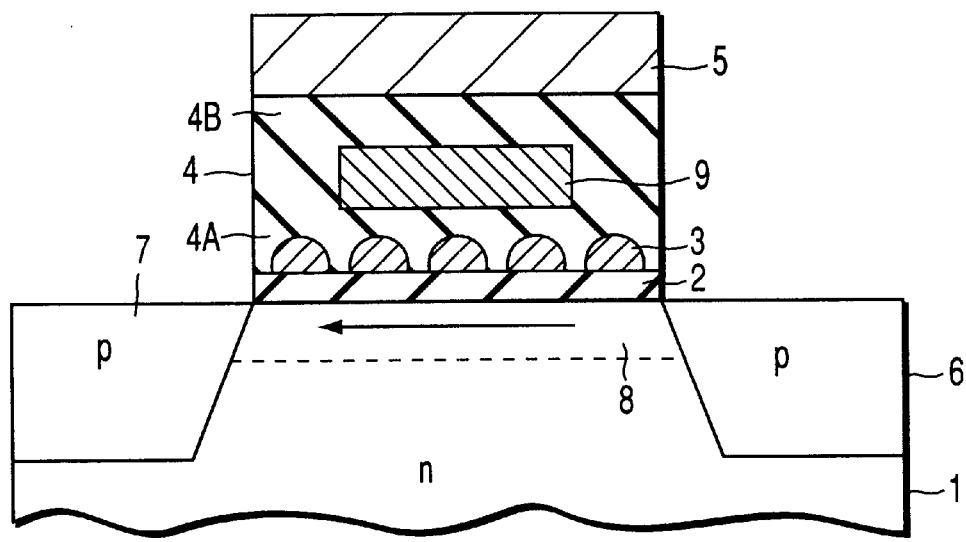
FIGS. 9A and 9B are sectional views illustrating the structures of semiconductor devices according to a fifth embodiment of the invention.
Figure 9B:
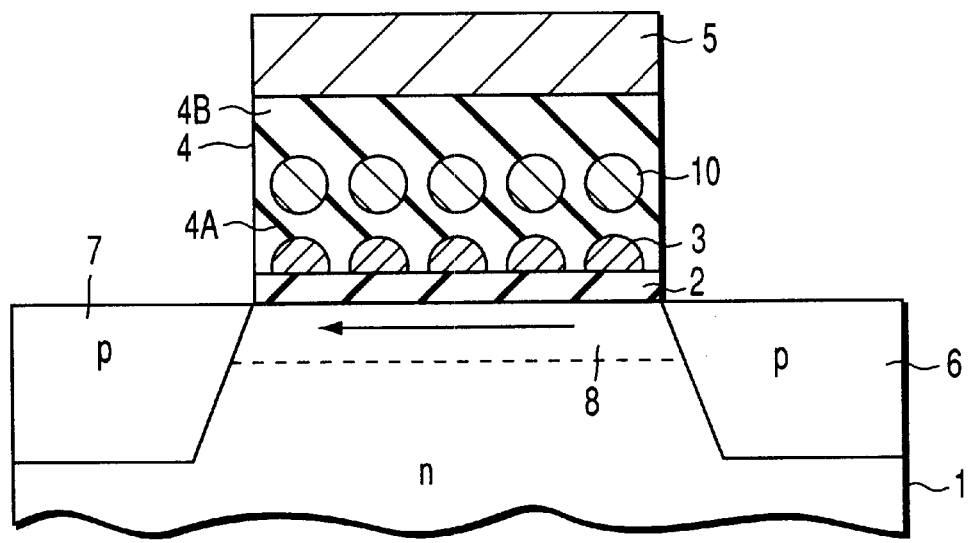

FIGS. 9A and 9B are sectional views illustrating the structures of semiconductor devices according to a fifth embodiment of the invention. An element similar to that in FIG. 6 is denoted by a corresponding reference numeral, and no detailed description will be given thereof.

The fifth embodiment differs from the second embodiment in that the former has charge accumulating layers (formed of magnetic fine particles or films) arranged in two stages. Specifically, in a semiconductor device shown in FIG. 9A, a magnetic film 9 (second charge accumulating layer) is formed on the layer (first charge accumulating layer) of the magnetic fine particles 3, with an Si oxide film 4A interposed therebetween. On the other hand, in a semiconductor device shown in FIG. 9B, the layer (second charge accumulating layer) of magnetic fine particles 10 is formed on the layer (first charge accumulating layer) of the magnetic fine particles 3, with an Si oxide film 4A interposed therebetween. Further, a gate electrode 5 is formed on the magnetic film 9 or the magnetic fine particles 10, with an Si oxide film 4B interposed therebetween. A low-resistance semiconductor film such as a polysilicon film may be used instead of the magnetic film 9 as the second charge accumulating layer.

The device of this embodiment is manufactured in a process stated as below. First, a device region is formed on the Si substrate 1 by the usual LSI process. Then, magnetic Co fine particles 3 with a size of, for example, about 10 nm are provided on the Si substrate 1 by sputtering. In this process, uniaxial aelotropy for magnetization may be imparted to the magnetic fine particles 3 by sputtering in the magnetic field.

Subsequently, an Si oxide (SiO$_2$) film 4A (second gate insulating film) with a thickness of about 2 nm is formed on the magnetic fine particles 3 by CVD. Then, again using sputtering, a CoPt magnetic island 9 (magnetic film) as shown in FIG. 9A or the layer of Co magnetic fine particles 10 as shown in FIG. 9B is formed on the Si oxide film 4A. Further, an Si oxide film 4B (third gate insulating film) with a thickness of about 3 nm is formed by CVD on the magnetic island 9 or the magnetic fine particles 10.

After that, a polysilicon film is deposited on the Si oxide film 4B by LPCVD and patterned into a gate electrode 5. Then, a p-type impurity is implanted into a surface of the substrate by ion implantation, using the gate electrode 5 as a mask, thereby forming the source and drain regions 6 and 7.

An SOI substrate may be used in place of the Si substrate 1. Further, a material other than Co, such as Fe, FeNi, Ni, CoPt, etc., may be used for the magnetic fine particles 3.

In the subsequent process steps, contact holes are formed after an interlayer insulating film is formed, and lines are formed to connect the electrode with three terminals to external electrodes.

Since in the fifth embodiment constructed as above, both the magnetic fine particles 3 and the magnetic film 9 (or a low-resistance semiconductor film) or the layer of the magnetic fine particles 10 serve as charge accumulating layers, the same advantage as the second embodiment can be obtained. Moreover, in the fifth embodiment, the accumulation amount of tunnel charge, i.e. the amount of charge accumulated in the charge accumulating layers, can be increased as compared with the second embodiment, thereby increasing a change in threshold voltage. Increase of a change in threshold voltage means an increase in read margin when the device is used as a memory device.

The invention is not limited to the abovedescribed embodiments. The method for forming the charge accumulating layer is not limited to sputtering, but may be electron beam deposition, resistance heating, etc. Further, CVD can be used as the method.

Although in the embodiments, Co is the material of the magnetic fine particles 3 and 10, other materials such as Fe, FeNi, Ni, CoPt, etc. may be used. Further, an alloy of Co, Fe, FeNi, Ni, CoPt, etc. and Al, Ti, Au, etc. obtained by simultaneously sputtering these substances may be used as the material of the magnetic fine particles 3 and 10. Also, an alloy of Co, Fe, FeNi, Ni, CoPt, etc. and a semiconductor such as Si, Ge, GaAs, etc. may be used as the material of the magnetic fine particles 3 and 10. The size of the magnetic fine particles 3 and 10 as the charge accumulating layers is set at 100 nm or less, and desirably at 1 nm–50 nm, in order to accurately control the tunnel electrons.

Although the embodiments employ insulators (gate insulating films) as films respectively provided under the charge accumulating layer and the gate, a semiconductor such as a high resistor (for example, a high resistance Si) may be made to epitaxially grow instead of the insulators. In other words, the gate insulating film may be formed of a high resistor as well as an insulator. The high resistor is a substance that has an electrical resistance twice or more than that of the material of the magnetic fine particles or film. For example, although the embodiments employ an Si oxide film as the gate insulating film, SiN, Mg oxide that is more liable to be oxidized than the magnetic substance, alumina, Ca oxide, Li oxide, nitrogen oxide or aluminum nitride may be used as the material of the gate insulating film. Alternatively, a semiconductor that has a large band gap, such as AlGaAs, may be used.

The invention can be modified in various manners without departing from its scope.

As described above in detail, using magnetic fine particles or a magnetic film as a charge accumulating layer enables a decrease in threshold voltage of a floating-type device which uses the single electron effect, and also enables a sufficient increase in charge retention time. Accordingly, the semiconductor device of the invention can be used as a non-volatile memory.

In addition, in a semiconductor device of the invention where a magnetic substance is directly provided on a semiconductor substrate, a Schottky barrier is formed between the magnetic substance (metal) and the semiconductor substrate, which can omit the step of forming a tunnel oxide film and hence is very advantageous in manufacturing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a charge accumulating layer containing a magnetic substance and formed directly on a semiconductor substrate;
   a gate insulating film formed on the charge accumulating layer;
   a gate electrode formed on the gate insulating film; and
   source and drain regions formed in surface portions of the semiconductor substrate such that the gate electrode is interposed therebetween.

2. A semiconductor device according to claim 1, wherein the magnetic substance of the charge accumulating layer is in the form of fine particles.

3. A semiconductor device according to claim 1, wherein the magnetic substance of the charge accumulating layer is in the form of a thin film.

4. A semiconductor device according to claim 1, wherein the gate insulating film is formed of an insulating film in which a tunnel phenomenon occurs.

5. A semiconductor device comprising:
   a first gate insulating film formed on a semiconductor substrate;
   a charge accumulating layer containing a magnetic substance and formed on the first gate insulating film;
   a second gate insulating film formed on the charge accumulating layer;
   a gate electrode formed on the second gate insulating film; and
   source and drain regions formed in surface portions of the semiconductor substrate such that the gate electrode is interposed therebetween.

6. A semiconductor device according to claim 5, wherein the magnetic substance of the charge accumulating layer is in the form of fine particles.

7. A semiconductor device according to claim 5, wherein the magnetic substance of the charge accumulating layer is in the form of a thin film.

8. A semiconductor device according to claim 5, wherein the first gate insulating film is formed of an insulating film in which a tunnel phenomenon occurs.

9. A semiconductor device comprising:
   a first charge accumulating layer containing a magnetic substance and directly formed on a semiconductor substrate;
   a first gate insulating film formed on the first charge accumulating layer;
   at least one second charge accumulating layer containing a magnetic substance and formed on the first gate insulating film;
   a second gate insulating film formed on the second charge accumulating layer;
   a gate electrode formed on the second gate insulating film; and
   source and drain regions formed in surface portions of the semiconductor substrate such that the gate electrode is interposed therebetween.

10. A semiconductor device according to claim 9, wherein the magnetic substance of the first charge accumulating layer is in the form of fine particles, and the magnetic substance of the second charge accumulating layer is in the form of a thin film.

11. A semiconductor device according to claim 9, wherein the magnetic substance of each of the first and second charge accumulating layers is in the form of fine particles.

12. A semiconductor device according to claim 9, wherein the first gate insulating film is formed of an insulating film in which a tunnel phenomenon occurs.

13. A semiconductor device comprising:
   a first gate insulating film formed on a semiconductor substrate;
   a first charge accumulating layer containing a magnetic substance and formed on the first gate insulating film;
   a second gate insulating film formed on the first charge accumulating layer;
   at least one second charge accumulating layer containing a magnetic substance and formed on the second gate insulating film;
   a third gate insulating film formed on the second charge accumulating layer;
   a gate electrode formed on the third gate insulating film; and
   source and drain regions formed in surface portions of the semiconductor substrate such that the gate electrode is interposed therebetween.

14. A semiconductor device according to claim 13, wherein the magnetic substance of the first charge accumulating layer is in the form of fine particles, and the magnetic substance of the second charge accumulating layer is in the form of a thin film.

15. A semiconductor device according to claim 13, wherein the magnetic substance of each of the first and second charge accumulating layers is in the form of fine particles.

16. A semiconductor device according to claim 5, wherein the first and second gate insulating films are formed of an insulating film in which a tunnel phenomenon occurs.

* * * * *